(12) United States Patent
Michel et al.

(10) Patent No.: US 10,916,257 B2
(45) Date of Patent: Feb. 9, 2021

(54) METHOD AND DEVICE FOR EQUALIZING AUDIO SIGNALS

(71) Applicants: Alan Dean Michel, Carmel, IN (US); Jason Chen, Shanghai (CN); Simon Liu, Shanghai (CN); Po-Hsun Sung, Shanghai (CN)

(72) Inventors: Alan Dean Michel, Carmel, IN (US); Jason Chen, Shanghai (CN); Simon Liu, Shanghai (CN); Po-Hsun Sung, Shanghai (CN)

(73) Assignee: Harman International Industries, Incorporated, Stamford, CT (US)

( * ) Notice: Subject to any disclaimer, the term of this patent is extended or adjusted under 35 U.S.C. 154(b) by 0 days.

(21) Appl. No.: 16/467,296

(22) PCT Filed: Dec. 6, 2016

(86) PCT No.: PCT/CN2016/108635
§ 371 (c)(1),
(2) Date: Jun. 6, 2019

(87) PCT Pub. No.: WO2018/102976
PCT Pub. Date: Jun. 14, 2018

(65) Prior Publication Data
US 2020/0082839 A1    Mar. 12, 2020

(51) Int. Cl.
*G10L 21/0232* (2013.01)
*H04R 3/00* (2006.01)
(Continued)

(52) U.S. Cl.
CPC .......... *G10L 21/0232* (2013.01); *G10L 25/21* (2013.01); *H03G 5/165* (2013.01); *H04R 3/02* (2013.01); *G10L 2021/02082* (2013.01)

(58) Field of Classification Search
CPC ................ G10L 21/0232; G10L 25/21; G10L 2021/02082; H03G 5/165; H04R 3/02
(Continued)

(56) References Cited

U.S. PATENT DOCUMENTS

2008/0031471 A1    2/2008  Haulick
2009/0110218 A1    4/2009  Swain
(Continued)

FOREIGN PATENT DOCUMENTS

CN    101064974 A    10/2007
JP    H05211700 A    8/1993

OTHER PUBLICATIONS

Tektronix ("Understanding FFT Overlap Processing Fundamentals", Primer manual, 2009) (Year: 2009).*

*Primary Examiner* — Vivian C Chin
*Assistant Examiner* — Douglas J Suthers
(74) *Attorney, Agent, or Firm* — Angela M. Brunetti

(57) ABSTRACT

A method and a device for equalizing audio signals, where the method includes: obtaining an audio signal (S401); acquiring an echo estimate that is caused by a sound reflection off one or more objects (S403); acquiring correction data based on the audio signal and the echo estimate (S405); and equalizing the audio signal based on the correction data (S407). Accordingly, by virtue of the method and the device for equalizing audio signals, equalization can be performed automatically in real time to match an audio signal to a desired reference frequency response with consideration of spatial acoustics, such as indirect echoes.

15 Claims, 4 Drawing Sheets

(51) Int. Cl.
  *H04R 3/04* (2006.01)
  *H04R 1/40* (2006.01)
  *G10L 25/21* (2013.01)
  *H03G 5/16* (2006.01)
  *H04R 3/02* (2006.01)
  *G10L 21/0208* (2013.01)

(58) Field of Classification Search
  USPC .......................................................... 381/66
  See application file for complete search history.

(56) References Cited

U.S. PATENT DOCUMENTS

2013/0230184 A1   9/2013   Kuech et al.
2014/0177859 A1   6/2014   Ahgren
2015/0263692 A1*  9/2015   Bush ........................ H03G 3/32
                                                    381/86

* cited by examiner

METHOD AND DEVICE FOR EQUALIZING AUDIO SIGNALS

TECHNICAL FIELD

The present disclosure relates to audio data processing, and more particularly, to a method and a device for equalizing audio signals.

BACKGROUND

Conventionally, audio equalization is performed manually, and hence, quality of the audio equalization is dependent on users' hearing ability for discerning good acoustics. The quality of the audio equalization is determined based on a frequency response desired by users. In existing technologies, instead of manual equalization, there are some automatic equalization systems. Typically, audio equalization in a roam requires a microphone to be set up in the room at a distance from the loudspeaker, ideally where the listener will listen. However, once the microphone is moved or environment in the room changes, the automatic audio equalization setup has to be performed again because the equalization is made specifically based on one location or environment.

SUMMARY

This invention makes use of a microphone mounted in a loudspeaker, where the microphone listens for both the direct audio from the loudspeaker, and the audio reflections from the roam and objects within the room By separating these two audio signals, the loudspeaker can be equalized, where a loudspeaker output based on the reflections and objects within the room affects a listener's perceived audio frequency response from the loudspeaker.

Embodiments of the present disclosure provide a method for equalizing audio signals, which comprises: obtaining an audio signal; acquiring an echo estimate that is caused by a sound reflection off one or more objects (e.g. a wall, a table, a door); acquiring correction data based on the audio signal and the echo estimate; and equalizing the audio signal based on the correction data.

In some embodiments, acquiring the echo estimate comprises: obtaining a complete echo estimate for a previous audio signal; and truncating the complete echo estimate to remove a direct echo estimate, so as to acquire the echo estimate corresponding, to an indirect echo.

In some embodiments, the complete echo estimate is obtained periodically, where the period is determined based on a residue of previous echo estimation.

In some embodiments, acquiring the correction data based on the audio signal and the echo estimate comprises: acquiring, energy of the audio signal and energy of the echo estimate; and acquiring the correction data based on the energy of the audio signal, the energy of the echo estimate and a preset reference frequency response that is related to equipment type or acoustic environment.

In some embodiments, acquiring the correction data based on the energy of the audio signal, the energy of the echo estimate and the preset reference frequency response comprises: acquiring an energy difference between the energy of the audio signal and the energy of the echo estimate; and acquiring the correction data based on a difference between the energy difference and the preset reference frequency response.

In some embodiments, equalizing the audio signal based on the correction data comprises: equalizing the audio signal based on a set of correction factors that are acquired based on the correction data.

In some embodiments, equalizing the audio signal comprises changing a set of gains for the audio signal based on the set of correction factors.

In some embodiments, equalizing the audio signal comprises changing a set of gains for the audio signal based on a fraction of the set of correction factors.

The embodiments of the present disclosure further provide a device for equalizing audio signals, which comprises: an energy acquisition circuitry, configured to obtain an audio signal; an indirect echo acquisition circuitry, configured to acquire an echo estimate that is caused by a sound reflection off one or more objects; a correction data acquisition circuitry, configured to acquire correction data based on the audio signal and the echo estimate; and an equalizer, configured to equalize the audio signal based on the correction data.

In some embodiments, the indirect echo acquisition circuitry acquires the echo estimate comprises: obtaining a complete echo estimate for a previous audio signal; and truncating the complete echo estimate, removing the direct audio path and transducer responses, to acquire the room's echo estimate.

In some embodiments, the indirect echo acquisition circuitry obtains the complete echo estimate periodically, where the period is determined based a residue of previous echo estimation.

In some embodiments, the energy acquisition circuitry is further configured to acquire energy of the audio signal and energy of the echo estimate.

In some embodiments, the correction data acquisition circuitry acquires the correction data comprises: acquiring the correction data based on the energy of the audio signal, the energy of the echo estimate and a preset reference frequency response that is related to equipment type or acoustic environment.

In some embodiments, the correction data acquisition circuitry acquires the correction data comprises: obtaining an energy difference between the energy of the audio signal and the energy of the echo estimate; and acquiring the correction data based on a difference between the energy difference and the preset reference frequency response.

In some embodiments, the equalizer equalizes the audio signal comprises: acquiring a set of correction factors based on the correction data; and equalizing the audio signal based on the set of correction factors.

In some embodiments, equalizing the audio signal based on the set of correction factors comprises: changing a set of gains for the frequency bands of the audio signal based on the set of correction factors.

In some embodiments, equalizing the audio signal based on the set of correction factors comprises: changing a set of gains for the frequency bands of the audio signal based on a fraction of the set of correction factors.

By virtue of the method and the device for equalizing audio signals in the present disclosure, equalization can be performed automatically in real time to match an audio signal to a desired reference frequency response with consideration of spatial acoustics, such as indirect echoes.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several embodiments in accordance with the disclosure and are, therefore, not to be considered as limitation to its scope, the disclosure will be described with additional specificity and detail through use of the accompanying drawings.

DETAILED DESCRIPTION

Figure 1:
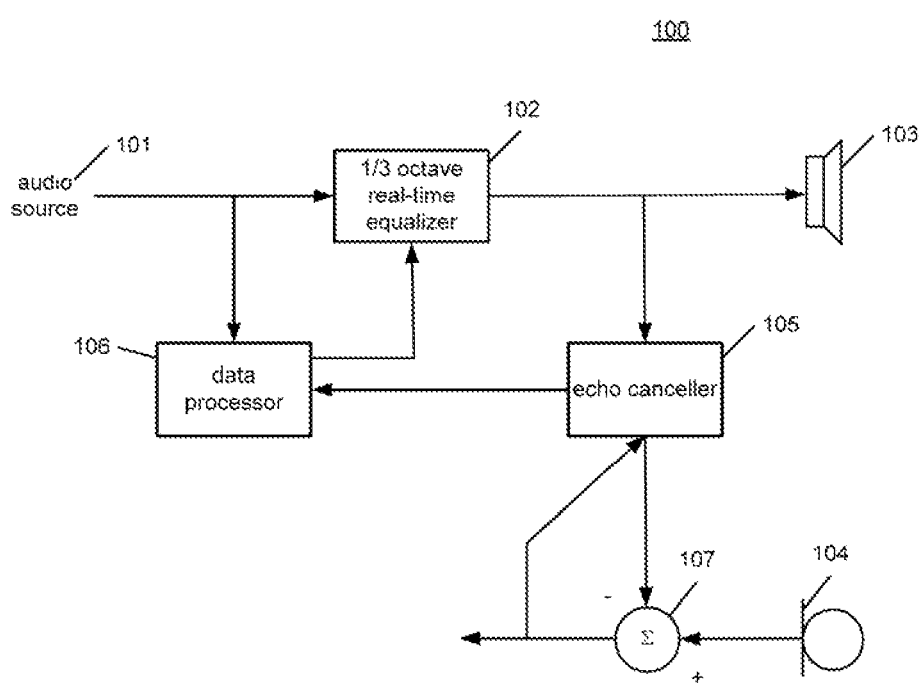
FIG. 1 schematically illustrates a block diagram for an audio system according to an embodiment in the present disclosure.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limitation. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and make part of this disclosure.

FIG. 1 schematically illustrates a block diagram for an audio system 100 according to an embodiment in the present disclosure. The audio system 100 includes an audio source 101, a ⅓ octave real-time equalizer 102 (i.e. a graphic equalizer), a loudspeaker 103, a microphone 104, an echo canceller 105 and a data processor 106.

In some embodiments, the audio source 101 may provide a first audio signal for the data processor 106 and the ⅓ octave real-time equalizer 102. The ⅓ octave real-time equalizer 102 then provide a first equalized audio signal for the loudspeaker 103 and the echo canceller 105. The loudspeaker 103 converts the first equalized audio signal into a first audio and plays the first audio.

Specifically, the echo canceller 105 is configured to acquire a complete echo estimate based on the first equalized audio signal and a residue for a previous echo estimate. The echo canceller 105 is well known to one ordinary skilled person in the art.

The audio system 100 includes an adder 107, where the adder 107 is configured to subtract the previous echo estimate obtained by the echo canceller 105 from a microphone audio signal, where the previous echo estimate is acquired based on a previous equalized audio signal prior to the first equalized audio signal. Thus, the residue for the previous echo estimate is acquired and fed back to the echo canceller 105. The echo canceller 105 then makes the complete echo estimate based on the first equalized audio signal and the residue, and provides the data processor 106 with the complete echo estimate.

In practice, the microphone 104 may receive other audio, including echoes for the first audio. In some embodiments, the echoes for the first audio may include a group of direct echoes and a group of indirect echoes. Specifically, the group of direct echoes include an echo from the loudspeaker 103 to the microphone 104 directly or a group of indirect echoes from the loudspeaker 103 to the microphone 104 with reflection off an object near the loudspeaker 103, where the reflection may not be affected by spatial acoustics. Moreover, the group of indirect echoes may include one or more echoes from the loudspeaker 103 to the microphone 104 with reflection off one or more objects inside a space, where the reflection is affected by spatial acoustics.

The complete echo estimate obtained by the echo canceller 105 includes a direct echo estimate corresponding to the group of direct echoes and an indirect echo estimate corresponding to the group of indirect echoes.

In some embodiments, the echo canceller 105 may provide the data processor 106 with an echo estimate periodically. The period may be set adaptively based on a residue acquired from the adder 107, and for example, if the residue is small, a long period is applied such as 1 minute, or 5 minutes, or 10 minutes or more than 10 minutes; if the residue is large, a short period is applied such as 5 seconds, or 15 seconds, or 30 seconds.

The data processor 106 is configured to generate correction data based on the first audio signal and the complete echo estimate, and further provide the correction data for the ⅓ octave real-time equalizer 102 in order for equalizing a next audio signal from the audio source 101 after the first audio signal.

Figure 2A:
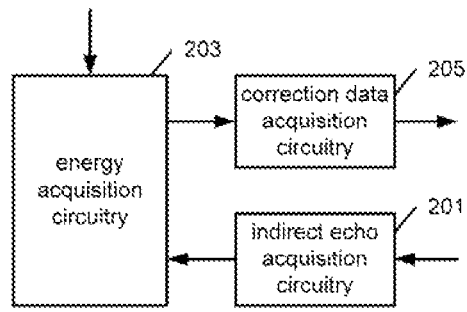
FIG. 2a schematically illustrates a block diagram for a data processor according to an embodiment in the present disclosure.

FIG. 2a schematically illustrates a block diagram for the data processor 106 according to an embodiment in the present disclosure. The data processor 106 includes an indirect echo acquisition circuitry 201, an energy acquisition circuitry 203 and a correction data acquisition circuitry 205.

In some embodiments, the indirect echo acquisition circuitry 201 is configured to obtain the complete echo estimate, and then acquires an indirect echo estimate from the complete echo estimate.

In some embodiments, the energy acquisition circuitry 203 is configured to obtain the first audio signal and the indirect echo estimate, and then acquires energy of the first audio signal and energy of the indirect echo estimate.

In some embodiments, the correction data acquisition circuitry 205 is configured to acquire the correction data based on the energy of the first audio signal and the energy of the indirect echo estimate.

Figure 2B:
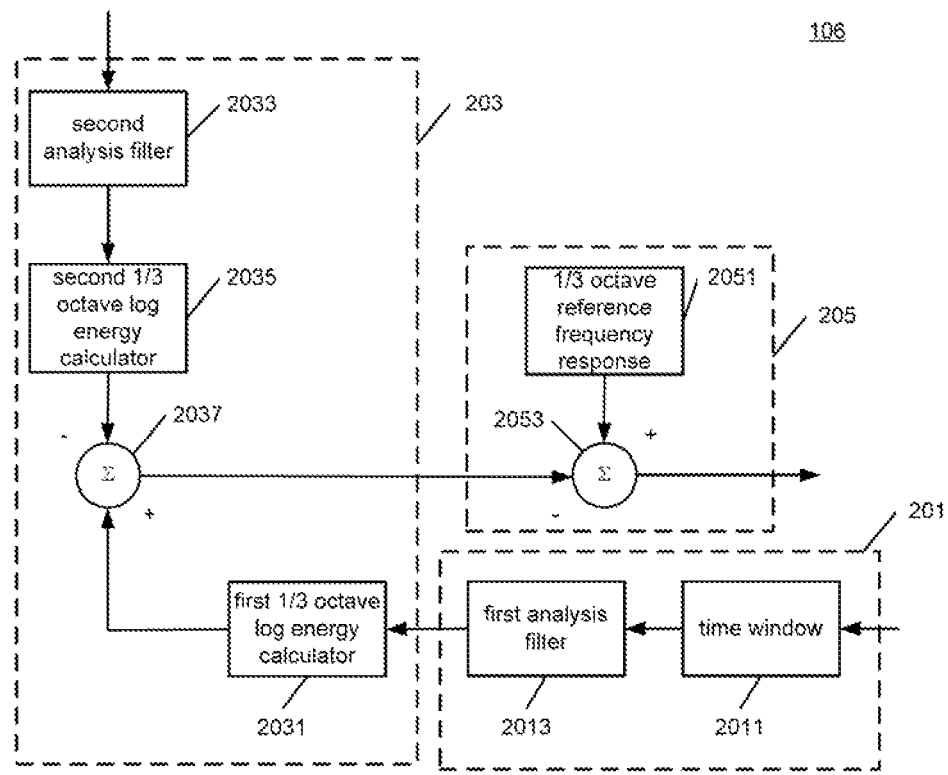
FIG. 2b schematically illustrates a block diagram for the data processor according to another embodiment in the present disclosure.

FIG. 2b schematically illustrates a block diagram for the data processor 106 according to another embodiment in the present disclosure. The data processor 106 includes the indirect echo acquisition circuitry 201, the energy acquisition circuitry 203 and the correction data acquisition circuitry 205, where the indirect echo acquisition circuitry 201 includes a time window 2011, a first analysis filter 2013, the energy acquisition circuitry 203 includes a first ⅓ octave log energy calculator 2031, a second analysis filter 2033, a second ⅓ octave log energy calculator 2035 and the correction data acquisition circuitry 205 includes a ⅓ octave reference frequency response 2051.

In some embodiments, the time window 2011 may truncate the complete echo estimate by removing the direct echo estimate according to the time sequence of echoes.

In some embodiments, the time window 2011 may truncate the complete echo estimate by removing an echo estimate within a time period from a starting time point of the complete echo estimate to about 10 to 20 milliseconds after the starting time point. Specifically, with a sound traveling 343 meters/second, or 1000 ft per second, assuming an impulse response of the loudspeaker 103 being fairly short with cutoff frequency at or above 100 Hz and damped, and further assuming the microphone 104 is within a foot of the loudspeaker 103, a portion of the complete echo estimate beyond about 10 to 20 milliseconds could be considered as the indirect echo estimate. In some embodiments, the time window 201 may truncate the complete echo estimate by removing echo estimates within a time period from the starting time point of the complete echo estimate to 20 milliseconds after the starting time point. Specifically, with a room that is 10 feet by 10 feet or larger, a portion of the complete echo estimate beyond 20 milliseconds mainly includes reflections bouncing around the room from wall to wall and being absorbed by objects in the room, where acoustic energy decays from absorption. In some embodiments, size of the time window 2011 may be determined based on practical situations such as height of a room, objects arrangement in a room, etc. The time window 2011 may provide the truncated echo estimate for the first analysis filter 2013.

The first analysis filter 2013 is configured to convert the truncated echo estimate from the time-domain representation into the frequency-domain representation by performing the Fourier transform (e.g. the FFT algorithm), and then, divides the truncated echo estimate into a group of sub-band truncated echo estimates by applying a filter bank including a low-pass filter, a high-pass filter and a group of band-pass filters. The first analysis filter 203 may then provide the group of sub-band truncated echo estimates for the first ⅓ octave log energy calculator 2031.

In some embodiments, the first ⅓ octave log energy calculator 2031 is configured to acquire a set of energy in each ⅓ octave band based on the group of sub-band truncated echo estimates and convert the acquired set of energy into a decibel representation. Specifically, the echo canceller 105 normally does a good job at adjusting echo estimation at all frequencies as long as there is energy in all frequency bands over time. If there are certain frequency bands without much short term energy in them relative to others, the echo canceller 105 will tend to emphasize minimizing an error in an echo estimate with a high energy level, especially. Generally, echo cancellers are designed to minimize total echo energy, so that bands with a low energy level have a poorer estimation compared to bands with a high energy level. Thus, log energy is applied for ensuring that the bands with a high energy level are not over-emphasized, and the bands with a low energy level are not ignored.

In some embodiments, the first audio signal is provided for the second analysis filter 2033. The second analysis filter 2033 is configured to convert the first audio signal from the time-domain representation into the frequency-domain representation by performing the Fourier transform (e.g. the FFT algorithm), and then, divide the first audio signal into a group of sub-band first audio signals by applying, a filter bank including, a low-pass filter, a high-pass filter and a group of band-pass filters. The second analysis filter 2033 then provides the group of sub-band first audio signals for the second ⅓ octave log energy calculator 2035.

In some embodiments, the second ⅓ octave log energy calculator 2035 is configured to acquire a set of energy in each ⅓ octave band based on the group of sub-band first audio signals and convert the acquired set of energy into the decibel representation.

Further referring to FIG. 2b, in some embodiments, the energy acquisition circuitry 203 may further include a first adder 2037, where the first adder 2037 is configured to acquire a difference between the acquired set of log energy from the first ⅓ octave log energy calculator 2031 and the acquired set of log energy from the second ⅓ octave log energy calculator 2035, so as to acquire a set of net log energy, where the set of net log energy include a set of ⅓ octave band log energy.

In some embodiments, the correction data acquisition circuitry 205 may further include a second adder 2053, where the second adder 2053 is configured to acquire a difference between the set of net log energy and a log frequency response of the ⅓ octave reference frequency response 2051, where the reference frequency response 2051 may be selected according an audio preference such as a curves that a user has for optimizing audio quality of a headphone, or a specific requirement for a product such as a particular model loudspeaker. Specifically, the difference indicates a distance to the log frequency response of the ⅓ octave reference frequency response 2051 based on the set of net log energy.

Figure 3:
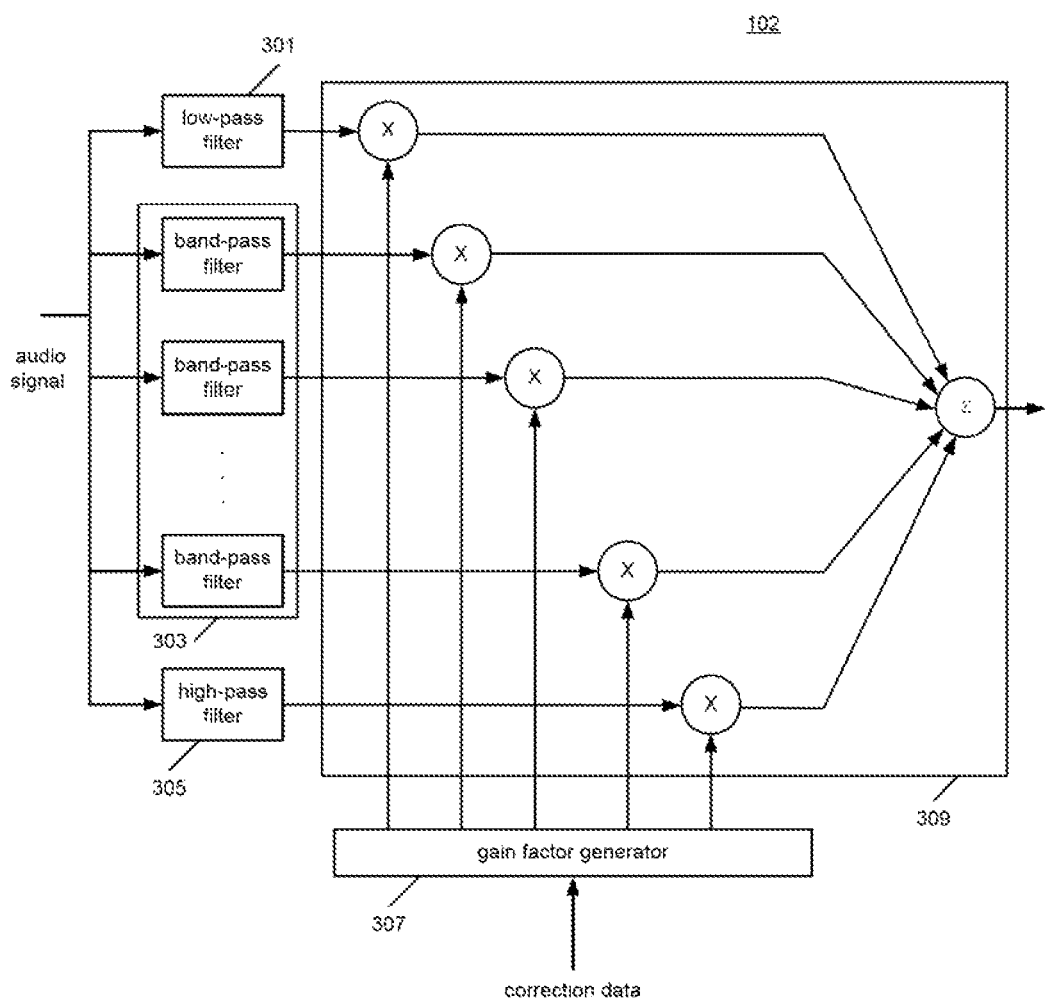
FIG. 3 schematically illustrates a block diagram for a ⅓ octave real-time equalizer according to an embodiment in the present disclosure.

In some embodiments, the difference may be provided for the ⅓ octave real-time equalizer 102 in a manner of correction data, and the ⅓ octave real-time equalizer 102 may equalize the next audio signal based on the correction data in order to match the next audio signal to the reference frequency response 2051. FIG. 3 schematically illustrates a block diagram for the ⅓ octave real-time equalizer 102 according to an embodiment in the present disclosure. The ⅓ octave real-time equalizer 102 includes a low-pass filter 301, a group of band-pass filters 303, a high-pass filter 305 and a gain factor generator 307.

It is appreciated to one ordinary skilled person in the art that coefficients for the low-pass filter 301, band-pass filters of the group of band-pass filters 303 and the high-pass filter 305 could be acquired by calculation according to standard text formulas. The low-pass filter 301, the band-pass filters of the group of band-pass filters 303 and the high-pass filter 305 are pre-configured for the ⅓ octave real-time equalizer 102 and maintained constant in real time. After the next audio signal goes through the low-pass filter 301, the band-pass filters of the group of band-pass filters 303 and the high-pass filter 305, a set of sub-band next audio signals are obtained.

In some embodiments, the gain factor generator 307 may generate a set of factors corresponding to the low-pass filter 301, the band-pass filters of the group of band-pass filters 303 and the high-pass filter 305 in order to modify gains of the set of sub-band next audio signals so as to equalize the next audio signal in real time. The algorithms for generating the set of factors are well known to one ordinary skilled person in the art. In some embodiments, the gain factor generator 307 may generate the set of factors periodically, where the period may be determined based on practical situations such as size of a room, requirements for audio quality, etc. In some embodiments, the gain factor generator 307 may acquire a set of correction factors based on the correction data, and the set of factors may be acquired based on the set of correction factors. In some embodiments, the set of factors may be the set of correction factors. In some embodiments, the set of factors may be a fraction of the set of correction factors. In this way, a stable equalization process could be realized and over-compensating and instability could be avoided.

In some embodiments, the gain factor generator 307 may be disposed outside the ⅓ octave real-time equalizer 102. In some embodiments, the gain factor generator 307 may be disposed in the data processor 106.

In an embodiment, the gain factor generator 307 may generate a set of correction factors every 5 seconds based on an average of correction data obtained within the every 5 seconds, and 10% of the set of correction factors is applied in the following step. In this case, in 200 seconds, a match rate of 98% for an equalized audio signal to the log frequency response of the ⅓ octave reference frequency response 2051 could be realized, and a match rate of 99.9% to the log frequency response of the ⅓ octave reference frequency response 2051 could be realized in 400 seconds. In some embodiments, other periods of time (e.g. 10 seconds, 20 seconds, 1 minute, 5 minutes) and other fraction percentages of the set of correction factors (e.g. 5%, 20%, 40%) may be applied.

The ⅓ octave real-time equalizer 102 further includes a weighted summation sub-unit 309 including a group of multipliers and a summator, where the weighted summation sub-unit 309 performs a weighted sum of the set of sub-band next audio signals respectively multiplied by the set of factors.

Accordingly, the ⅓ octave real-time equalizer 102 could automatically equalize an audio signal every period of time based on correction data output from the data processor 106 so as to match a frequency response of the audio signal to a frequency response of a desired reference frequency response, where the data processor 106 generates the correction data in real time based on an echo estimation from the echo canceller 105.

Figure 4:
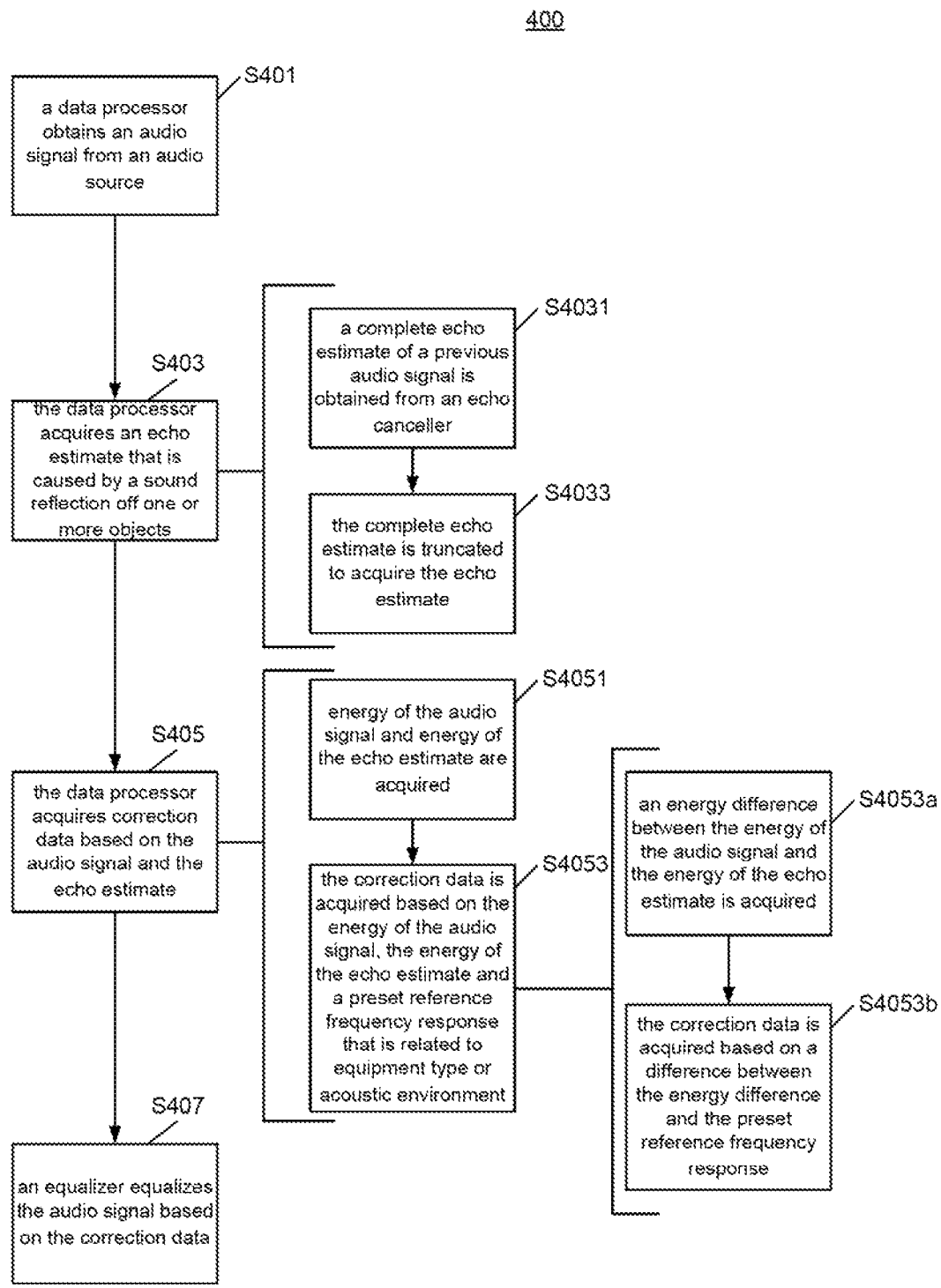
FIG. 4 schematically illustrates a flow diagram for a method for equalizing audio signals according to an embodiment in the present disclosure.

The embodiments of the present disclosure also provide a method for equalizing audio signals. FIG. 4 schematically illustrates a flow diagram for a method for equalizing audio signals 400 according to an embodiment in the present disclosure.

In S401, a data processor obtains an audio signal from an audio source.

In S403, the data processor acquires an echo estimate that is caused by a sound reflection off one or more objects. Specifically, in S4031, a complete echo estimate of a previous audio signal is obtained from an echo canceller, and in S4033, the complete echo estimate is truncated to acquire the echo estimate.

In some embodiments, the complete echo estimate is obtained periodically, where the period is determined based on a residue for a previous echo estimation by the echo canceller.

In S405, the data processor acquires correction data based on the audio signal and the echo estimate. Specifically, in 54051, energy of the audio signal and energy of the echo estimate are acquired, and in S4053, the correction data is acquired based on the energy of the audio signal, the energy of the echo estimate and a preset reference frequency response that is related to equipment type or acoustic environment.

Specifically, in S4053a, an energy difference between the energy of the audio signal and the energy of the echo estimate is acquired and in S4053b, the correction data is acquired based on a difference between the energy difference and the preset reference frequency response.

In S407, an equalizer equalizes the audio signal based on the correction data. Specifically, the audio signal is equalized based on a set of correction factors that are acquired based on the correction data. In some embodiments, the audio signal is equalized by changing a set of gains for the audio signal based on the set of correction factors. In some embodiments, the audio signal is equalized by changing a set of gains for the audio signal based on a fraction of the set of correction factors.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

The invention claimed is:

1. A method for equalizing audio signals, comprising:
obtaining an audio signal;
acquiring an echo estimate that is caused by a sound reflection off one or more objects by obtaining a complete echo estimate for a previous audio signal and truncating the complete echo estimate;
acquiring correction data based on the audio signal and the echo estimate; and
equalizing the audio signal based on the correction data.

2. The method according to claim 1, wherein the complete echo estimate is obtained periodically, where the period is determined based on a residue of previous echo estimation.

3. The method according to claim 1, wherein acquiring the correction data based on the audio signal and the echo estimate comprises: acquiring energy of the audio signal and energy of the echo estimate; and acquiring the correction data based on the energy of the audio signal, the energy of the echo estimate and a preset reference frequency response that is related to equipment type or acoustic environment.

4. The method according to claim 3, wherein acquiring the correction data based on the energy of the audio signal, the energy of the echo estimate and the preset reference frequency response comprises:
acquiring an energy difference between the energy of the audio signal and the energy of the echo estimate; and
acquiring the correction data based on a difference between the energy difference and the preset reference frequency response.

5. The method according to claim 1, wherein equalizing the audio signal based on the correction data comprises: equalizing the audio signal based on a set of correction factors that are acquired based on the correction data.

6. The method according to claim 5, wherein equalizing the audio signal comprises changing a set of gains for the audio signal based on the set of correction factors.

7. The method according to claim 5, wherein equalizing the audio signal comprises changing a set of gains for the audio signal based on a fraction of each correction factor in the set of correction factors.

8. A device for equalizing audio signals, comprising:
an energy acquisition circuitry, configured to obtain an audio signal;
an indirect echo acquisition circuitry, configured to acquire an echo estimate that is caused by a sound reflection off one or more objects by obtaining a complete echo estimate for a previous audio signal and truncating the complete echo estimate to acquire the echo estimate;
a correction data acquisition circuitry, configured to acquire correction data based on the audio signal and the echo estimate; and
an equalizer, configured to equalize the audio signal based on the correction data.

9. The device according to claim 8, wherein the indirect echo acquisition circuitry obtains the complete echo estimate periodically, where the period is determined based a residue of previous echo estimation.

10. The device according to claim 8, wherein the energy acquisition circuitry is further configured to acquire energy of the audio signal and energy of the echo estimate.

11. The device according to claim 10, wherein the correction data acquisition circuitry acquires the correction data comprises:

acquiring the correction data based on the energy of the audio signal, the energy of the echo estimate and a preset reference frequency response that is related to equipment type or acoustic environment.

12. The device according to claim 11, wherein the correction data acquisition circuitry acquires the correction data comprises:

obtaining an energy difference between the energy of the audio signal and the energy of the echo estimate; and acquiring the correction data based on a difference between the energy difference and the preset reference frequency response.

13. The device according to claim 12, wherein the equalizer equalizes the audio signal comprises:

acquiring a set of correction factors based on the correction data; and equalizing the audio signal based on the set of correction factors.

14. The device according to claim 13, wherein equalizing the audio signal based on the set of correction factors comprises:

changing a set of gains for the audio signal based on the set of correction factors.

15. The device according to claim 13, wherein equalizing the audio signal based on the set of correction factors comprises:

changing a set of gains for the audio signal based on a fraction of each correction factor in the set of correction factors.

* * * * *